United States Patent [19]

Tamaki

[11] 4,324,991
[45] Apr. 13, 1982

[54] VOLTAGE SELECTOR CIRCUIT

[75] Inventor: Nobuo Tamaki, Murayama, Japan

[73] Assignee: Casio Computer Co., Ltd., Tokyo, Japan

[21] Appl. No.: 102,773

[22] Filed: Dec. 12, 1979

[51] Int. Cl.³ ............... H03K 19/003; H03K 19/094; H03K 17/30; H03K 17/693
[52] U.S. Cl. ............................. 307/443; 307/473; 307/579; 307/585; 340/804
[58] Field of Search ............... 307/205, 209, 251, 297, 307/304, 473, 579, 585; 340/803, 804, 811, 813; 368/68, 219, 86, 87

[56] References Cited

U.S. PATENT DOCUMENTS

| | | | |
|---|---|---|---|
| 3,936,676 | 2/1976 | Fujita | 307/205 X |
| 3,949,242 | 4/1976 | Hirasawa et al. | |
| 3,976,984 | 8/1976 | Hirasawa | |
| 4,027,305 | 5/1977 | Kishimoto | 307/205 X |
| 4,038,564 | 7/1977 | Hakata | 307/205 |
| 4,039,869 | 8/1977 | Goldman et al. | 307/DIG. 1 X |
| 4,115,710 | 9/1978 | Lou | 307/304 |

FOREIGN PATENT DOCUMENTS 1472657 of 0000 France .
1151417 of 0000 United Kingdom .

OTHER PUBLICATIONS

Electrical Design News, Band 18, Nr. 10, 20 May 1973.

*Primary Examiner*—Larry N. Anagnos
*Attorney, Agent, or Firm*—Frishauf, Holtz, Goodman & Woodward

[57] ABSTRACT

In a voltage selector circuit, a plurality of supply voltages are respectively supplied to a plurality of switching elements formed of MOS transistors. The plurality of switching elements are turned on and off according to the voltage levels of input signals supplied thereto, and a voltage waveform signal corresponding to one selected among the supply voltages is taken out from a common output terminal. The substrate electrode of a specified one of the switching elements is supplied with a corresponding supply voltage as the substrate voltage in response to a voltage change of the voltage waveform signal taken out selectively, thereby reducing power loss in the circuit.

4 Claims, 10 Drawing Figures

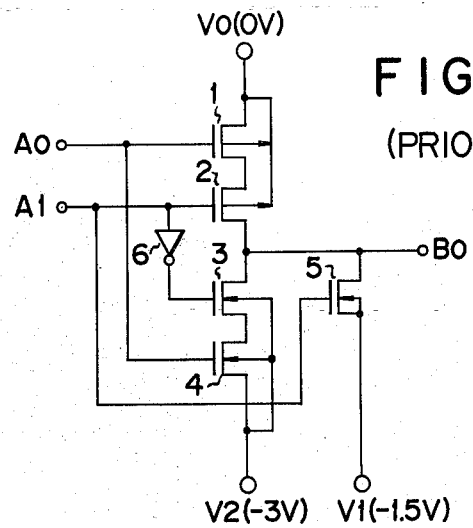
FIG. 1
(PRIOR ART)
FIG. 2A A0
FIG. 2B A1
FIG. 2C B0
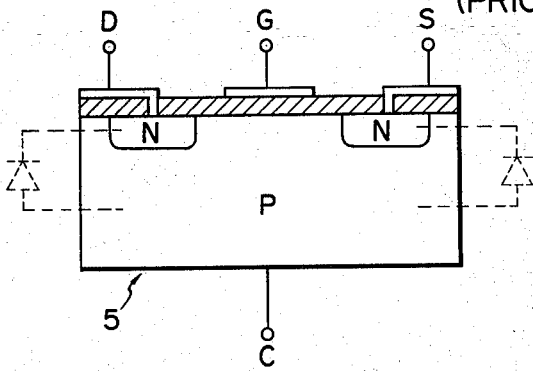
FIG. 3 (PRIOR ART)

FIG. 4
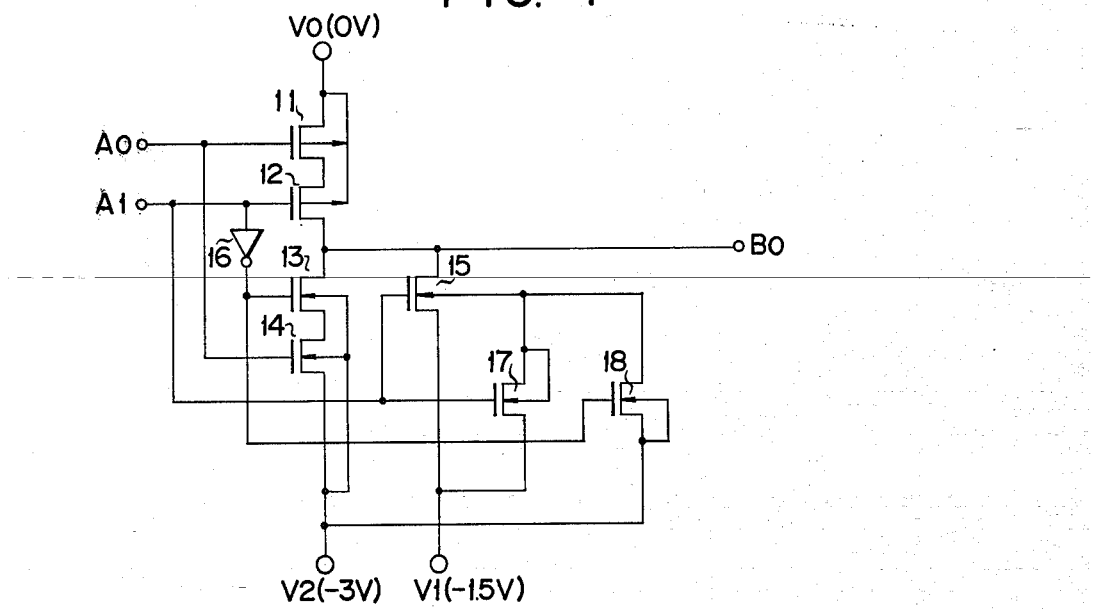
FIG. 5A  A0
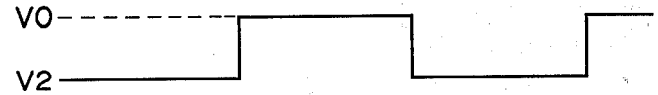
FIG. 5B  A1
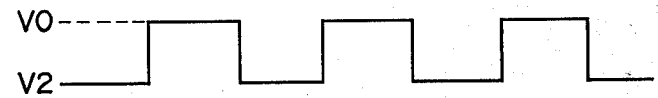
FIG. 5C  B0
FIG. 5D
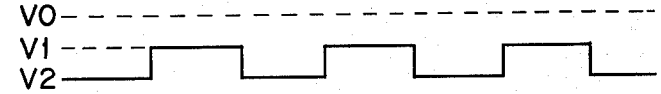

VOLTAGE SELECTOR CIRCUIT

BACKGROUND OF THE INVENTION

This invention relates to a voltage selector circuit capable of selectively taking out a plurality of voltages at different levels.

Generally, in driving liquid-crystal display devices for electronic desk top calculators, electronic watches or clocks, etc. according to a dynamic-drive display system, it is necessary to use signals consisting of voltages at 3-value or more levels. Also, in an ink-jet-type printing system, for example, it is required that signals from a character signal generator circuit be D/A-converted as voltage signals at a plurality of levels and to then be successively be delivered to deflecting electrodes in accordance with printed characters. In order to obtain such voltages at a plurality of levels, there is used a voltage selector circuit generally so constructed as shown in FIG. 1. The circuit of FIG. 1 is a voltage selector circuit for taking out voltage waveform signals (common electrode driving signals) at 3-value levels to be supplied to a liquid-crystal display device when dynamically driving the display device. In FIG. 1, numerals 1 and 2 designate p-type MOS transistors, while numerals 3, 4 and 5 designate n-type transistors. The gates of the MOS transistors 1 and 4 are supplied with an input signal $A_0$ (32 Hz) as shown in FIG. 2(A), the gates of the MOS transistors 2 and 5 are supplied with an input signal $A_1$ (64 Hz) as shown in FIG. 2(B), and the signal $A_1$ is applied to the gate of the MOS transistor 3 through an inverter 6. Further, voltages $V_0$ (0 V), $V_1$ (−1.5 V) and $V_2$ (−3 V) are supplied to the sources of the MOS transistors 1, 5 and 4, respectively. The respective drains of the MOS transistors 2, 3 and 5 are connected together to form an output terminal $B_0$.

With such a construction, when the voltage levels of the input signals $A_0$ and $A_1$ are both low, the MOS transistors 1, 2 and 3 are turned on, and the MOS transistors 4 and 5 are turned off, so that the voltage $V_0$ appears at the output terminal $B_0$. When the voltage levels of the input signals $A_0$ and $A_1$ are low and high respectively, the MOS transistors 1 and 5 are turned on, and the MOS transistors 2, 3 and 4 are turned off, so that the voltage $V_1$ appears at the output terminal $B_0$. On the other hand, when the voltage levels of the input signals $A_0$ and $A_1$ are high and low respectively, the MOS transistors 2, 3 and 4 are turned on, and the MOS transistors 1 and 5 are turned off, so that the voltage $V_2$ is delivered from the output terminal $B_0$. By such switching operations of those individual transistors, a voltage waveform signal at 3-value levels as shown in FIG. 2(C) may be obtained from the output terminal $B_0$.

The MOS transistor 5 constitutes the point of this circuit. FIG. 3 specifically shows the arrangement of the MOS transistor 5, in which n-type semiconductor layers are formed on a p-type semiconductor substrate at both right and left sides thereof, the substrate being supplied with a substrate voltage C. In this MOS transistor 5, when the voltage at the output terminal $B_0$ is the voltage $V_2$ (−3 V), the drain electrode is supplied with the voltage $V_2$ (−3 V), and the voltage $V_1$ (−1.5 V) is applied to the substrate electrode which is supplied with the same voltage as the source voltage. As generally known, a diode characteristic as indicated by broken lines of FIG. 3 is seen between the drain and substrate, so that the voltages are applied in the forward direction in the aforesaid state. Thus, a diode effect arises to produce a current flow, causing power loss. As a result, the life of batteries used as a power source for some electronic devices, such as electronic wrist watches, will be shortened, requiring more frequent replacement of batteries.

SUMMARY OF THE INVENTION

This invention is contrived in consideration of the above-mentioned circumstances, and is intended to provide a voltage selector circuit capable of eliminating power loss caused by the potential difference between the voltage of the output signal and the substrate voltage and ensuring prolonged life of batteries.

In order to attain the above object of the invention, there is provided a voltage selector circuit in which a voltage waveform signal corresponding to one selected among voltages from a plurality of power sources is taken out from a common output terminal by selectively turning on and off switching elements formed of MOS transistors, the circuit being characterized in that a corresponding one of the supply voltages is supplied to the substrate electrode of a specified one of the switching elements according to the voltage waveform signal.

As a result, according to the invention, there will never be caused any power loss due to the diode effect between the drain and substrate electrodes of the MOS transistor whose drain electrode is connected to the common output terminal. Thus, there may be obtained a voltage selector circuit which may very effectively be applied to miniature electronic devices or systems using batteries as a working power source, for example.

BRIEF DESCRIPTION OF THE DRAWINGS

FIG. 1 is a circuit diagram of a prior art voltage selector circuit;

FIGS. 2(A) to 2(C) show a time chart of input and output signals for the circuit shown in FIG. 1;

FIG. 3 shows the structure of an n-type MOS transistor;

FIG. 4 is a circuit diagram of a voltage selector circuit according to an embodiment of this invention; and FIGS. 5(A) to 5(D) show a time chart of input and output signals and a substrate voltage waveform signal for the circuit shown in FIG. 4.

DETAILED DESCRIPTION

Referring now to the drawings of FIGS. 4 and 5(A) to 5(B), and embodiment of this invention will be described in detail.

In FIG. 4, numerals 11 and 12 designate p-type MOS transistors, while numerals 13, 14 and 15 designate n-type MOS transistors. A signal $A_0$ (32 Hz) is applied to the gates of the MOS transistors 11 and 14, and a signal $A_1$ (64 Hz) is applied to the gates of the transistors 12 and 15 and also supplied to the gate of the transistor 13 through an inverter 16. Such construction is just the same as the one shown in FIG. 1. The substrate electrode of the transistor 15 is connected with the source of an n-type MOS transistor 17 and the drain of an n-type MOS transistor 18. The gate and drain of the MOS transistor 17 are supplied with the signal $A_1$ and a voltage $V_1$ respectively. Further, the gate and source of the transistor 18 are supplied with the output signal of the inverter 16 and a voltage $V_2$ respectively.

In a voltage selector circuit of the above-mentioned construction, the voltage wavelength signal delivered from an output terminal $B_0$ is just the same as the one described in connection with FIG. 1. In the transistor 15, when the voltage levels of the input signals $A_0$ and $A_1$ are both low, a voltage $V_0$ (0 V) appears at the output terminal $B_0$, and the MOS transistors 17 and 18 are turned off and on respectively, so that the voltage $V_2$ (−3 V) is applied to the substrate electrode of the transistor 15. When the voltage levels of the input signals $A_0$ and $A_1$ are low and high respectively, the voltage $V_1$ (−1.5 V) is delivered from the output terminal $B_0$, and the MOS transistors 17 and 18 are turned on and off respectively, so that the voltage $V_1$ (−1.5 V) is applied to the substrate electrode of the MOS transistor 15. On the other hand, when the voltage levles of the input signals $A_0$ and $A_1$ are high and low respectively, the voltage $V_2$ (−3 V) is delivered from the output terminal $B_0$, and the MOS transistors 17 and 18 are turned off and on respectively, so that the voltage $V_2$ (−3 V) is applied to the substrate electrode of the MOS transistor 15. By such switching operations of the MOS transistors 17 and 18, the substrate electrode of the MOS transistor 15 is supplied with a substrate voltage waveform signal as shown in FIG. 5(D). Waveforms of FIGS. 5(A) to 5(C) are identical with the ones shown in FIGS. 2(A) to 2(C) respectively.

As may be seen from the substrate voltage waveform of FIG. 5(D), the voltage $V_2$ (−3 V) lower than the voltage $V_0$ (0 V) is applied to the substrate electrode of MOS transistor 15 when the output signal $B_0$ is at the voltage $V_0$. Further, the voltage $V_1$ (−1.5 V) or $V_2$ (−3 V) is applied to the substrate electrode of MOS transistor 15 when the output signal $B_0$ is at the voltage $V_1$ or $V_2$, respectively. Thus, the substrate voltage of the MOS transistor 15 may be so controlled as to be lower than or equal to the voltage of the output signal $B_0$, so that there will never be caused any power loss due to the diode effect between the drain and substrate.

Although the 3-value voltage waveform is obtained with use of the circuit according to the above-mentioned embodiment, the invention is not limited to that case, and may be also applied to the case where voltage waveforms including 4-value, 5-value or more levels are obtained. Furthermore, instead of controlling the substrate voltage of an n-type MOS transistor, the substrate voltage of a p-type MOS transistor may be controlled.

What is claimed is:
1. A voltage selector circuit comprising:
   a first switching circuit (11, 12) including at least one MOS transistor having a source, drain, gate and substrate and adapted to be operated in ON-OFF fashion by a control signal inputted to the gate thereof, a voltage ($V_0$) of a first voltage level being inputted to the source of said at least one MOS transistor of said first switching circuit;
   a second switching circuit (13, 14) including at least one MOS transistor having a source, drain, gate and substrate and adapted to be operated in ON-OFF fashion by a control signal inputted to the gate thereof, a voltage ($V_2$) of a second voltage level different from said first voltage level being inputted to the source of said at least one MOS transistor of said second switching circuit;
   a third switching circuit (15) including at least one MOS transistor (15) having a source, drain, gate and substrate and adapted to be operated in ON-OFF fashion by a control signal inputted to the gate thereof, a voltage ($V_1$) of a third voltage level being inputted to the source of said at least one MOS transistor of said third switching circuit, said third voltage level being between said first and second voltage levels;
   an output terminal ($B_0$) connected to at least said first to third switching circuits and to which a voltage inputted to the source of an On-operated switching circuit is delivered as an output; and
   a fourth switching circuit (17, 18) connected to the substrate of said at least one MOS transistor (15) of said third switching circuit for causing a voltage supplied to said substrate of said at least one MOS transistor of said third switching circuit to be switched according to the voltage which is outputted from said output terminal ($B_0$).

2. A voltage selector circuit according to claim 1, wherein said at least one MOS transistor (15) of said third switching circuit is an N-type transistor and said fourth switching circuit (17, 18) supplies said voltage ($V_2$) of said second voltage level to the substrate of said at least one MOS transistor of said third switching circuit by the On-operation of said fourth switching circuit when said voltage ($V_2$) of said second level is outputted from said output terminal, and said fourth switching circuit (17, 18) supplies a voltage of a level higher than said second voltage level to the substrate of said at least one MOS transistor of said third switching circuit when said voltage of a level higher than said voltage level is outputted from said output terminal.

3. A voltage selector circuit according to claim 1 or claim 2, wherein said fourth switching circuit comprises two MOS transistors (17, 18), a first MOS transistor of said fourth switching circuit having its gate coupled with said gate of said at least one transistor of said third switching circuit (15), a source coupled with the substrate of said at least one MOS transistor of said third switching circuit and a drain coupled with the source of said at least one MOS transistor of said third switching circuit; the second MOS transistor (18) of said fourth switching circuit having its drain connected to the substrate of said at least one MOS transistor of said third switching circuit and its source connected to said voltage ($V_2$) of said second voltage level, and a gate coupled to a control signal.

4. A voltage selector circuit according to claim 1 or claim 2, wherein said first switching circuit comprises a pair of MOS transistors (11, 12); said second switching circuit comprises a pair of MOS transistors (13, 14); and said third switching circuit comprises a single MOS transistor (15).

* * * * *